(12) United States Patent
Himmelmann

(10) Patent No.: US 10,876,424 B2
(45) Date of Patent: Dec. 29, 2020

(54) ENERGY RECOVERY MODULES, GENERATOR ARRANGEMENTS, AND METHODS OF RECOVERING ENERGY IN GENERATOR ARRANGEMENTS

(71) Applicant: Hamilton Sundstrand Corporation, Charlotte, NC (US)

(72) Inventor: Richard A. Himmelmann, Beloit, WI (US)

(73) Assignee: HAMILTON SUNSTRAND CORPORATION, Charlotte, NC (US)

( * ) Notice: Subject to any disclaimer, the term of this patent is extended or adjusted under 35 U.S.C. 154(b) by 47 days.

(21) Appl. No.: 16/383,625

(22) Filed: Apr. 14, 2019

(65) Prior Publication Data

US 2020/0325791 A1  Oct. 15, 2020

(51) Int. Cl.
| | | |
|---|---|---|
| *F01D 15/10* | (2006.01) | |
| *H02K 7/18* | (2006.01) | |
| *H02K 9/06* | (2006.01) | |
| *H01L 35/30* | (2006.01) | |
| *H02K 11/04* | (2016.01) | |
| *B64D 33/08* | (2006.01) | |
| *B64D 27/10* | (2006.01) | |

(Continued)

(52) U.S. Cl.
CPC ............. *F01D 15/10* (2013.01); *B64D 27/10* (2013.01); *B64D 33/08* (2013.01); *H01L 35/30* (2013.01); *H02K 7/1823* (2013.01); *H02K 9/06* (2013.01); *H02K 11/046* (2013.01); *B64C 39/024* (2013.01); *B64C 2201/042* (2013.01); *F05D 2220/329* (2013.01); *F05D 2220/62* (2013.01); *F05D 2220/768* (2013.01)

(58) Field of Classification Search
CPC ......... F01D 15/10; B64D 27/10; B64D 33/08; B64C 39/024; B64C 2201/042; H01L 35/30; H02K 7/1823; H02K 9/06; H02K 11/046; F05D 2220/329; F05D 2220/62; F05D 2220/768
USPC .............................................. 290/52; 60/650
See application file for complete search history.

(56) References Cited

U.S. PATENT DOCUMENTS 5,012,060 A * 4/1991 Gerard ...................... F22B 3/06
219/631
5,095,707 A * 3/1992 Eck ........................ B64G 1/421
165/903
(Continued)

FOREIGN PATENT DOCUMENTS

| CN | 204258668 U | 4/2015 |
|---|---|---|
| DE | 102017207532 A1 | 11/2018 |
| JP | 2001356037 A | 12/2001 |

OTHER PUBLICATIONS

European Search Report Application No. 19216095.0; dated Jul. 27, 2020; pp. 26.

*Primary Examiner* — Pedro J Cuevas
(74) *Attorney, Agent, or Firm* — Cantor Colburn LLP

(57) ABSTRACT

An energy recovery module includes a manifold, a permanent magnet generator arranged within the manifold, and a thermal electric generator. The thermal electric generator is arranged within the manifold and is electrically connected to the permanent magnet generator to provide electrical power to a load using energy recovered from an expanded decomposition or combustion products traversing the manifold. Generator arrangements, unmanned aerial vehicles, and methods of generating electric power are also described.

20 Claims, 12 Drawing Sheets

(51) Int. Cl.
*B64D 39/02* (2006.01)
*B64C 39/02* (2006.01)

(56) References Cited

U.S. PATENT DOCUMENTS

| | | | | |
|---|---|---|---|---|
| 5,537,823 | A * | 7/1996 | Vogel | F02C 1/007 60/590 |
| 6,784,565 | B2 * | 8/2004 | Wall | H02J 1/10 290/52 |
| 7,478,525 | B2 | 1/2009 | Iya et al. | |
| 7,603,860 | B2 * | 10/2009 | Thomas | F01D 15/00 60/650 |
| 8,669,670 | B2 * | 3/2014 | Donnelly | F01D 15/10 290/52 |
| 8,812,164 | B2 * | 8/2014 | Marchitto | F25B 27/00 700/288 |
| 9,024,460 | B2 | 5/2015 | Xu et al. | |
| 9,035,482 | B2 * | 5/2015 | Hui | F01D 1/32 290/52 |
| 9,370,050 | B2 * | 6/2016 | Okazaki | F03D 9/14 |
| 9,376,214 | B2 | 6/2016 | Ghoshal | |
| 9,605,657 | B2 * | 3/2017 | Okazaki | H02K 7/1823 |
| 9,732,699 | B2 * | 8/2017 | Vogel | F02G 1/04 |
| 9,885,289 | B2 | 2/2018 | Rechain et al. | |
| 10,397,986 | B2 * | 8/2019 | Kim | H05B 6/109 |
| 10,655,562 | B2 * | 5/2020 | Vogel | F02G 1/04 |
| 10,731,557 | B1 * | 8/2020 | Himmelmann | F01D 15/10 |
| 2006/0037348 | A1 * | 2/2006 | Kang | F25B 27/02 62/323.3 |
| 2011/0193346 | A1 * | 8/2011 | Guzman | F28D 21/0003 290/52 |
| 2012/0089256 | A1 * | 4/2012 | Marchitto | F03D 9/22 700/276 |
| 2012/0193924 | A1 * | 8/2012 | Okazaki | F03D 9/14 290/55 |
| 2013/0082529 | A1 * | 4/2013 | Wolter | H02J 7/35 307/46 |
| 2014/0056721 | A1 | 2/2014 | Garrard et al. | |
| 2014/0252772 | A1 * | 9/2014 | Hui | F01D 1/32 290/52 |
| 2014/0265347 | A1 * | 9/2014 | Paul | H02K 53/00 290/1 A |
| 2015/0318699 | A2 * | 11/2015 | Wolter | H02J 3/005 307/46 |
| 2015/0330261 | A1 * | 11/2015 | Held | F01D 11/003 60/326 |
| 2016/0252076 | A1 * | 9/2016 | Okazaki | H02K 7/1823 290/52 |
| 2017/0074157 | A1 | 3/2017 | Mitkari et al. | |
| 2017/0117716 | A1 * | 4/2017 | Wolter | H02J 3/005 |
| 2017/0291712 | A1 * | 10/2017 | Himmelmann | B64D 27/10 |
| 2017/0292447 | A1 * | 10/2017 | Himmelmann | F01K 23/10 |
| 2018/0298816 | A1 * | 10/2018 | Conde | F02C 6/18 |
| 2019/0055880 | A1 * | 2/2019 | Noderer | F25B 21/02 |
| 2019/0308741 | A1 * | 10/2019 | Dittmar | B64D 41/00 |

* cited by examiner

ENERGY RECOVERY MODULES, GENERATOR ARRANGEMENTS, AND METHODS OF RECOVERING ENERGY IN GENERATOR ARRANGEMENTS

BACKGROUND

The present disclosure generally relates to electrical power generation, and more particularly to recovering energy from expanded decomposition or combustion products in generator arrangements powered by turbines.

Unmanned aerial vehicles are commonly used in military and commercial applications for purposes of surveillance, mapping, infrastructure inspection, law enforcement, agriculture, delivery, search and rescue, and recreation by way of non-limiting example. Unmanned vehicles come in a variety of sizes, from micro surveillance drones the size of an insect to large aircraft-scale unmanned aerial vehicles. The power supply for an unmanned vehicle generally corresponds to the size of the unmanned aerial vehicle. For example, large unmanned aerial vehicles typically employ jet engines, turboprops, or reciprocating internal combustion engines for power. Mini and micro unmanned aerial vehicles typically employ battery power to provide energy during missions.

Medium-sized unmanned aerial vehicles, e.g., those requiring between 1 kilowatt and 30 kilowatts of power, can be limited to relatively short duration missions because the energy density of batteries is typically too low to work at these power levels while jet engines and reciprocating engines can be inefficient at these power levels. While tethered unmanned vehicles, i.e., unmanned vehicles tethered to a remote power source, can provide relatively long mission times, the tether can limit the operating height and distance over which a tethered unmanned aerial vehicle can operate.

Such systems and methods have generally been satisfactory for their intended purpose. However, there remains a need for improved generator arrangements, unmanned aerial vehicles, and methods of generating electrical power. The present disclosure provides a solution to this need.

BRIEF DESCRIPTION

An energy recovery module is provided. The energy recovery module includes a manifold, a permanent magnet generator arranged within the manifold, and a thermal electric generator. The thermal electric generator is arranged within the manifold and is electrically connected to the permanent magnet generator to provide electrical power to an electrical load using energy recovered from an expanded decomposition or combustion product flow traversing the energy recovery module.

In addition to one or more of the features described above, or as an alternative, further embodiments may include a heat exchanger arranged within the manifold, wherein the heat exchanger is in thermal communication with the thermal electric generator.

In addition to one or more of the features described above, or as an alternative, further embodiments may include wherein the heat exchanger extends circumferentially about the permanent magnet generator.

In addition to one or more of the features described above, or as an alternative, further embodiments may include wherein the heat exchanger has a diffuser vane array extending circumferentially about the permanent magnet generator.

In addition to one or more of the features described above, or as an alternative, further embodiments may include wherein the manifold has a turbine nozzle vane array extending circumferentially about the permanent magnet generator.

In addition to one or more of the features described above, or as an alternative, further embodiments may include wherein the manifold has an expanded decomposition or combustion products inlet, an ambient air inlet, and an expanded decomposition or combustion products/ambient air outlet each in fluid communication with the thermal electric generator.

In addition to one or more of the features described above, or as an alternative, further embodiments may include wherein a cold side of the thermal electric generator fluidly couples the ambient air inlet with the expanded decomposition or combustion products/ambient air outlet.

In addition to one or more of the features described above, or as an alternative, further embodiments may include wherein a hot side of the thermal electric generator fluidly couples expanded decomposition or combustion product inlet with the expanded decomposition or combustion product/ambient air mixture outlet.

In addition to one or more of the features described above, or as an alternative, further embodiments may include wherein the manifold includes a union fluidly coupling the expanded decomposition or combustion product inlet and the ambient air inlet to the expanded decomposition or combustion product/ambient air mixture outlet.

In addition to one or more of the features described above, or as an alternative, further embodiments may include wherein the permanent magnet generator includes a permanent magnet supported for rotation relative to the thermal electric generator about a rotation axis and a stator winding fixed relative to the thermal electric generator.

In addition to one or more of the features described above, or as an alternative, further embodiments may include a radial turbine fixed relative to the permanent magnet recover energy from the expanded decomposition or combustion product flow traversing the energy recovery module.

In addition to one or more of the features described above, or as an alternative, further embodiments may include an impeller fixed relative to the permanent magnet to draw ambient air into the manifold to cool the expanded decomposition or combustion product flow traversing the energy recovery module.

A generator arrangement is also provided. The generator arrangement includes an energy recovery module as described above, a power module in fluid communication with the manifold, and a fuel module in fluid communication the power module to provide flow of liquid fuel for generating electric power with the power module.

In addition to one or more of the features described above, or as an alternative, further embodiments may include wherein the power module includes a microturbine in fluid communication with the energy recovery module to communicate the expanded decomposition or combustion products to the energy recovery module.

In addition to one or more of the features described above, or as an alternative, further embodiments may include that the power module has a gas generator in fluid communication with the fuel module, a turbine in fluid communication with the gas generator, and an interconnect shaft fixed relative to the turbine. An alternator with one or more alternator permanent magnet and an alternator stator coil or winding is operably associated with the turbine, the one or more alternator permanent magnet being fixed relative to the interconnect shaft.

In addition to one or more of the features described above, or as an alternative, further embodiments may include that fuel module has a fuel header in fluid communication with the power module through a turbine speed control valve, a first fuel pressure vessel and a second fuel pressure vessel in fluid communication with the fuel header, and a compressed gas header in fluid communication with the first fuel pressure vessel and the second fuel pressure vessel. A compressed gas pressure vessel in fluid communication with the compressed gas header, and therethrough with the turbine speed control valve, through fuel header and first fuel pressure vessel and the second fuel pressure vessel.

In addition to one or more of the features described above, or as an alternative, further embodiments may include a charge of liquid mono-propellant or fuel contained in the fuel module and in fluid communication with the energy recovery module and a charge of compressed gas contained in the fuel module and urging the charge of liquid mono-propellant or fuel fluidly toward the energy recovery module.

An unmanned aerial vehicle is also provided. The unmanned aerial vehicle includes an energy recovery module as described above, the energy recovery module carried by the unmanned aerial vehicle; a power module with a microturbine in fluid communication with the energy recovery module, wherein the power module is carried by the unmanned aerial vehicle; and a fuel module in fluid communication with the power module and carried by the unmanned aerial vehicle, the energy recovery module electrically connected to an electrical load carried by the unmanned aerial vehicle.

A method of generating electric power is additionally provided. The method includes receiving a flow of expanded decomposition or combustion products at a manifold of an energy recovery module, generating electric power from the expanded decomposition or combustion products a thermal electric generator arranged within the manifold, and generating additional electric power from the expanded decomposition or combustion products using a permanent magnet generator arranged within the manifold. The expanded decomposition or combustion products are cooled quieted during traverse of the manifold.

Technical effects of the present disclosure includes the capability to generate electrical power using a relatively lightweight and efficient portable generator arrangement. In certain embodiments described herein an energy recovery module is employed to reduce the temperature of the turbine exhaust issued to the ambient environment by the power module turbine powering the generator arrangement, limiting the thermal signature associated with the power module during operation. In accordance with certain embodiments the energy recovery module is employed to reduce the noise associated with the power module turbine, limiting the acoustic signature associated with the power module during operation. It is also contemplated that, in accordance with certain embodiments, that energy recovery module convert thermal energy within the power module exhaust into electrical power, increasing the efficiency of the power module associated with the generator arrangement.

BRIEF DESCRIPTION OF THE DRAWINGS

The following descriptions should not be considered limiting in any way. With reference to the accompanying drawings, like elements are numbered alike.

DETAILED DESCRIPTION

Figure 1:
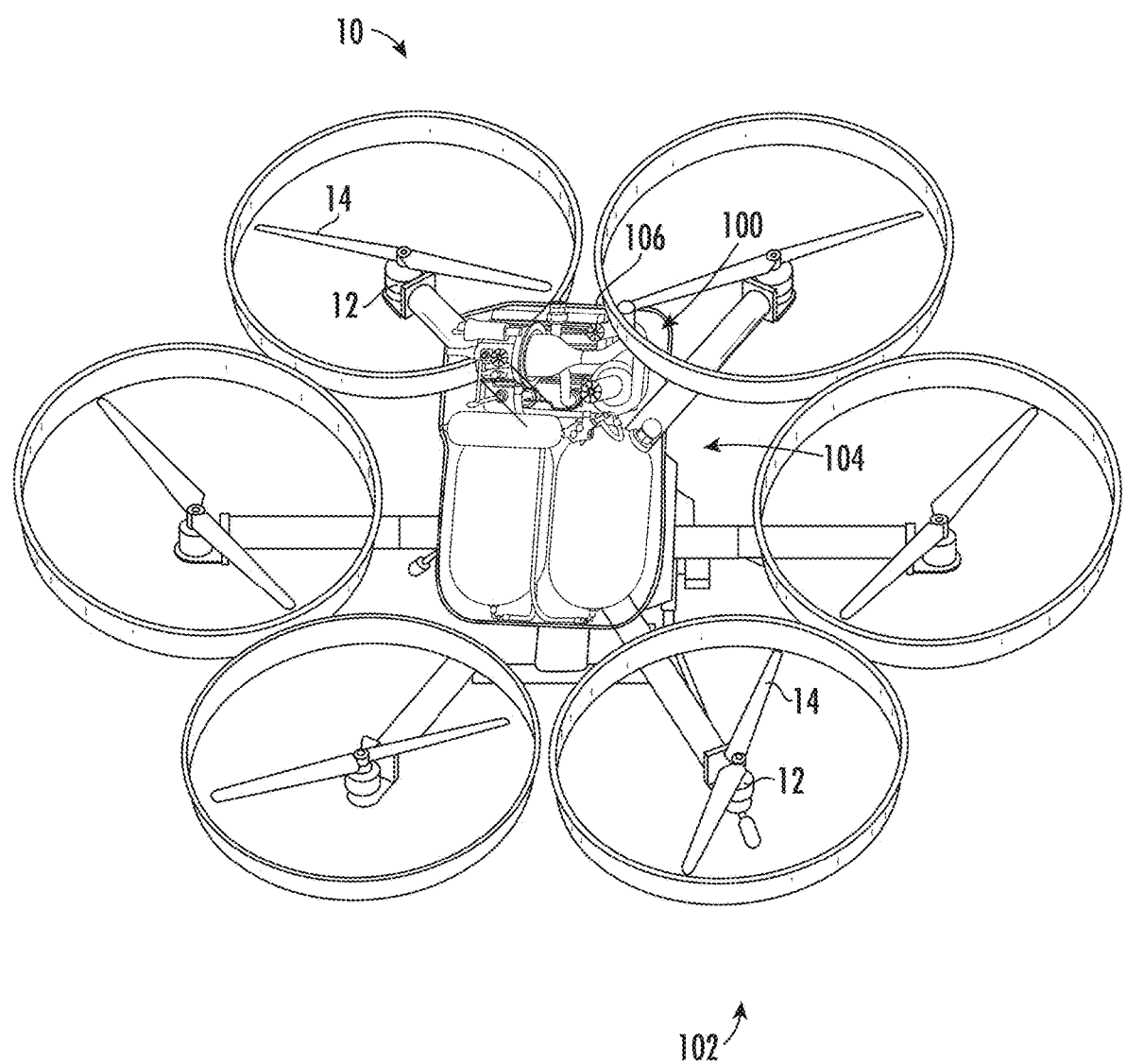
FIG. 1 is a perspective view of an energy recovery module constructed in accordance with the present disclosure, showing the energy recovery module and a power module of a generator arrangement carried by an unmanned aerial vehicle.

Reference will now be made to the drawings wherein like reference numerals identify similar structural features or aspects of the subject disclosure. For purposes of explanation and illustration, and not limitation, a partial view of an exemplary embodiment of an energy recovery module in accordance with the disclosure is shown in FIG. 1 and is designated generally by reference character 100. Other embodiments of energy recovery modules, generator arrangements, and methods of generating electrical power in accordance with the present disclosure, or aspects thereof, are provided in FIGS. 2-12, as will be described. The systems and methods described herein can be used generating electrical power in mobile applications, such as in unmanned aerial vehicles and soldier-exoskeletons, though the present disclosure is not limited to unmanned aerial vehicles and soldier-exoskeletons or to mobile applications in general.

Referring to FIG. 1, an unmanned aerial vehicle 102 is shown. The unmanned aerial vehicle 102 includes an electrical load 10 and a generator arrangement 104. The electrical load 10 includes a plurality of electric motors 12 operably connected to rotors 14 for providing lift to the unmanned aerial vehicle 102. The electric motors 12 are powered by electric power 16 (shown in FIG. 3) provided by operation of the generator arrangement 104 during flight. In this respect portions of the electric power 16 are provided to the electrical load 10 by the generator arrangement 104 by decomposing a liquid mono-propellant like Otto fuel or combusting a liquid fuel like gasoline, diesel fuel, or kerosene-based fuel like JP-8.

Figure 2:
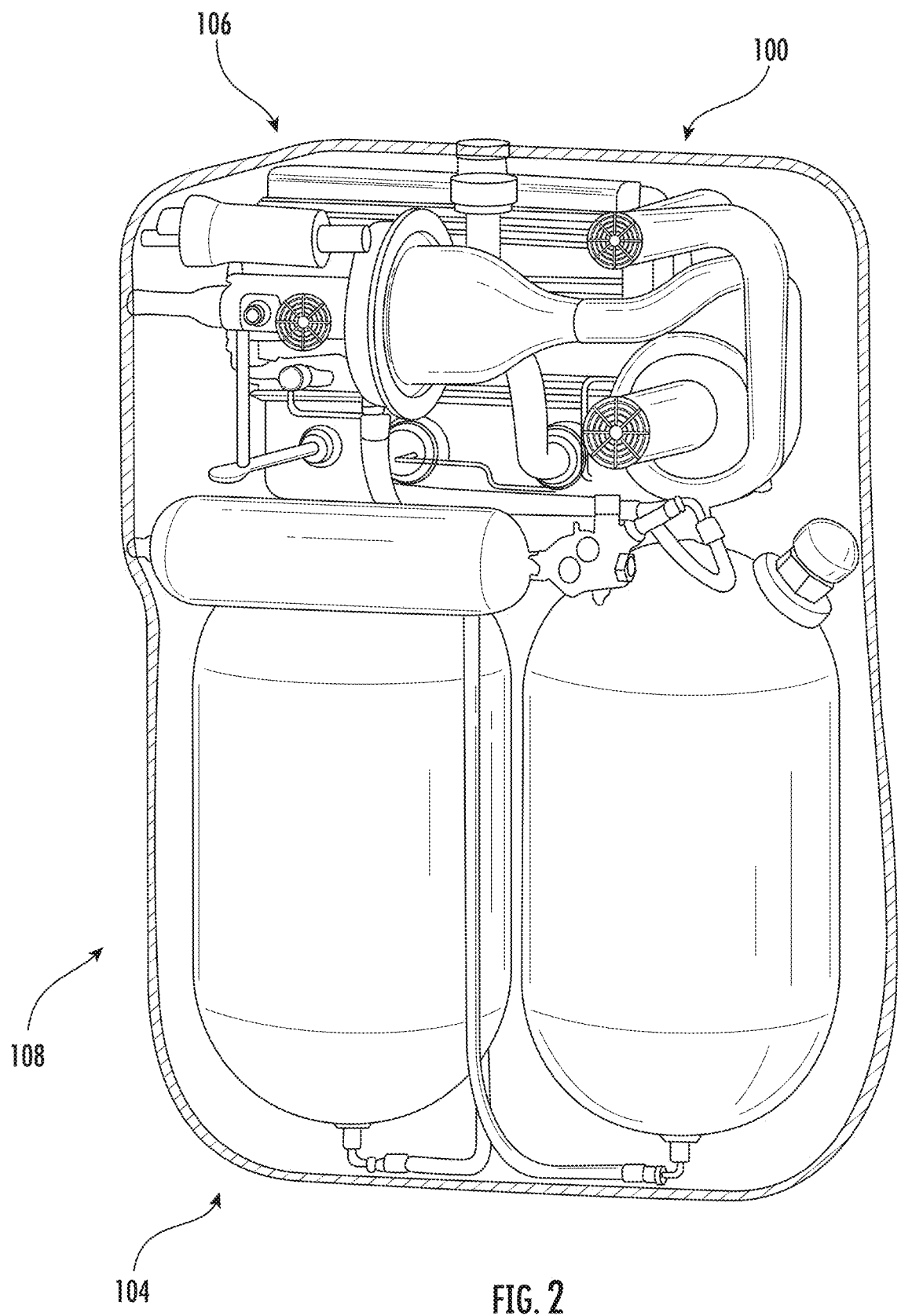
FIG. 2 is a perspective view of the energy recovery module of FIG. 1, showing a fuel module and the power module of the generator arrangement in fluid communication with the energy recovery module.
Figure 3:
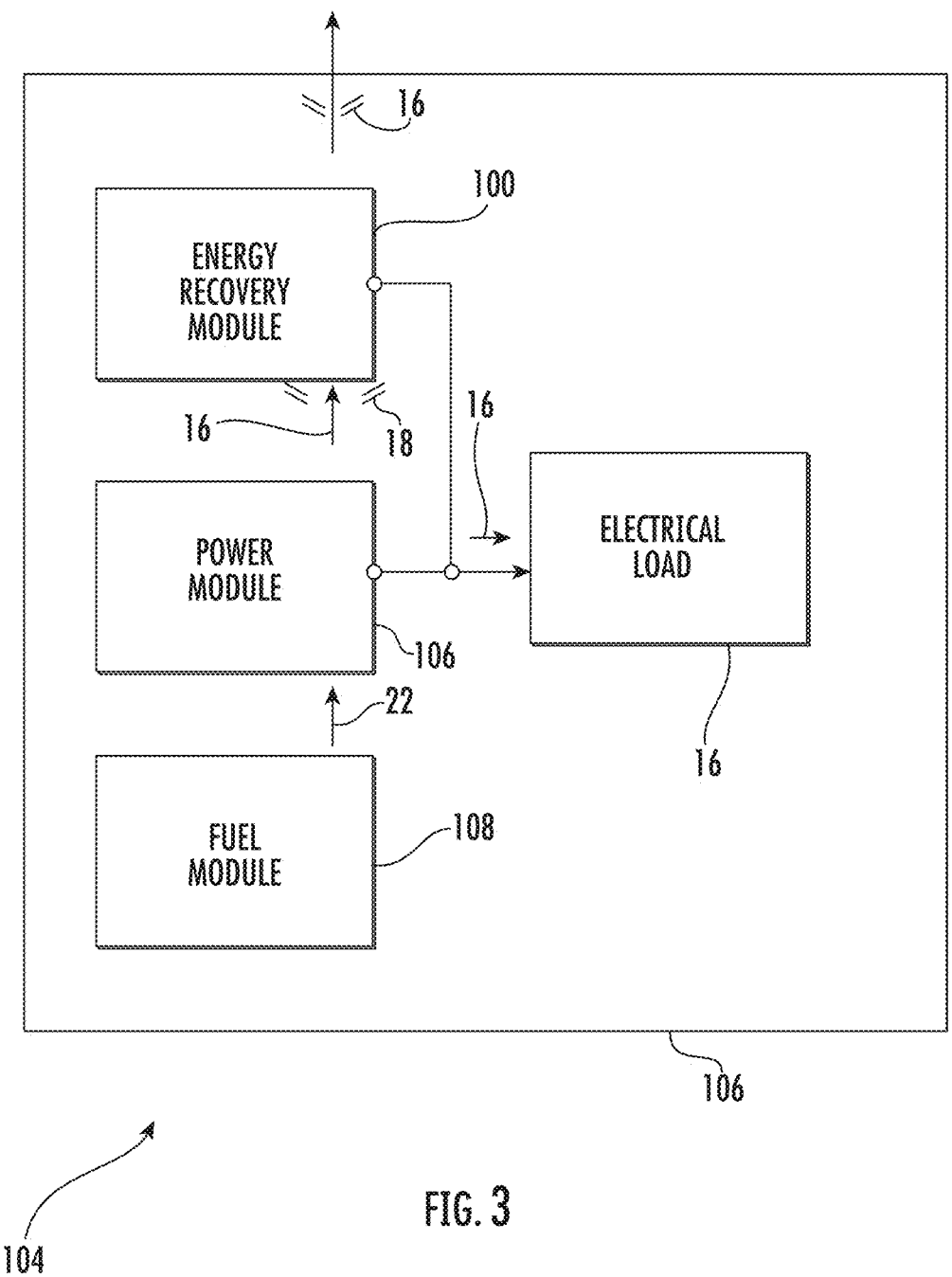
FIG. 3 is a schematic view of a generator arrangement of FIG. 1, showing an energy recovery module and the power module both electrically connected to an electrical load for providing electric power to the electrical load.

With reference to FIGS. 2 and 3, the generator arrangement 104 is shown. The generator arrangement 104 includes a power module 106, a fuel module 108, and the energy recovery module 100. The power module 106 is in fluid communication with the energy recovery module 100. The fuel module 108 is in fluid communication with the power module 106 to provide a flow of liquid mono-propellant or fuel 22 for generating a portion of the electric power 16 provided to the electrical load 10. The electric power 16 is provided to the electrical load 10, which is connected to the generator arrangement 104.

The energy recovery module 100 is configured to generate a portion of the electric power 16 using expanded decomposition or combustion products 20 provided to the energy recovery module 100 by the power module 106. In certain embodiments the energy recovery module 100 is also configured to attenuate noise 18 generated by the power module 106, limiting the audible signature of the generator arrangement 104 while generating the electric power 16. In accordance with certain embodiments the energy recovery module 100 is configured to cool the expanded decomposition or combustion products 20 by removing heat 24 (shown in FIG. 4) from the expanded decomposition or combustion products 20 as the expanded decomposition or combustion products 20 traverse the energy recovery module 100, limiting the thermal signature of the generator arrangement 104 while generating the electric power 16.

Figure 4:
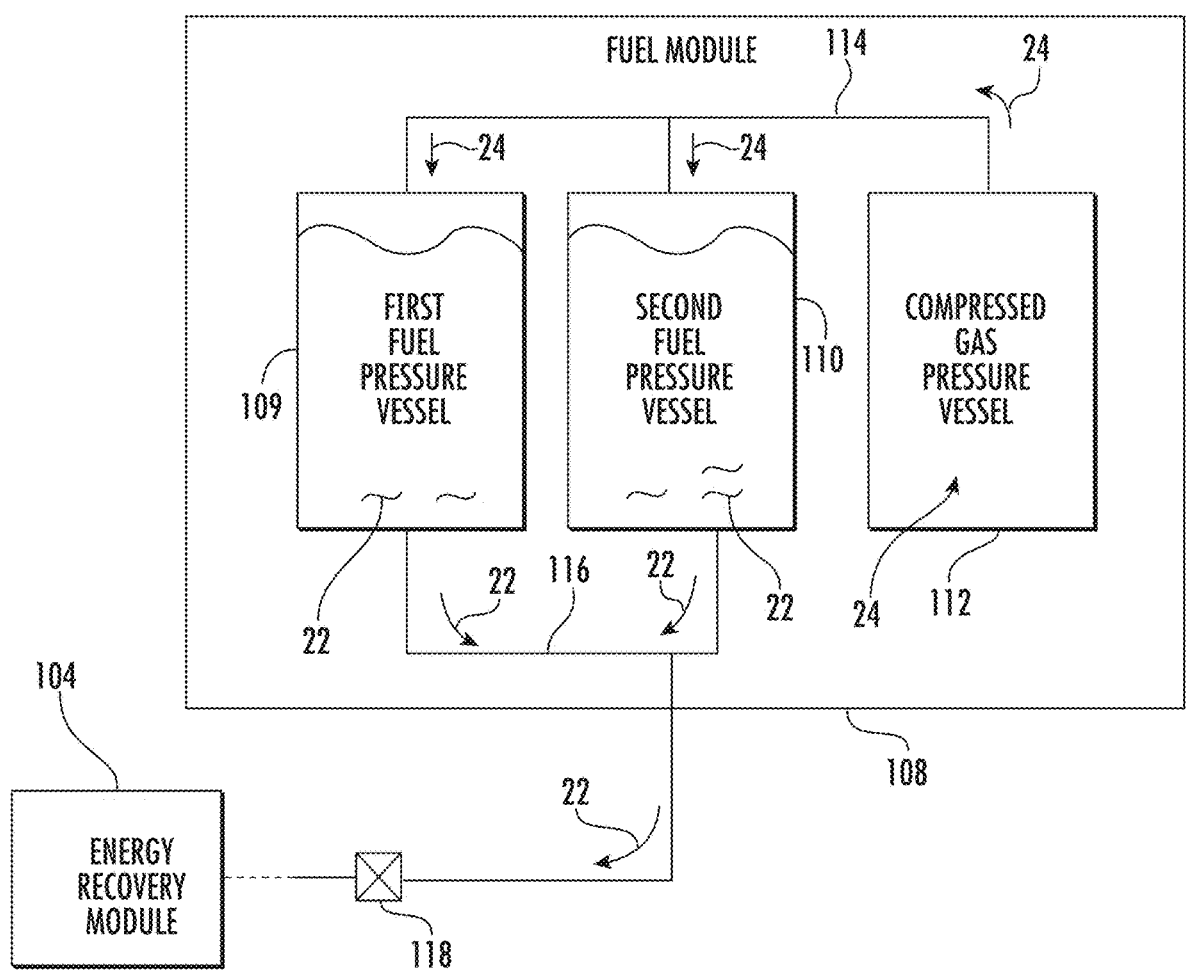
FIG. 4 is a schematic view of the fuel module of FIG. 1, showing the fuel module communicating a liquid mono-propellant or fuel to the power module.

With reference to FIG. 4, the fuel module 108 is shown. The fuel module 108 includes a first fuel pressure vessel 109, a second fuel pressure vessel 110, and a compressed gas pressure vessel 112. The fuel module 108 also includes a compressed gas header 114, a fuel header 116, and a turbine speed control valve 118.

The first fuel pressure vessel 109 and the second fuel pressure vessel 110 are in fluid communication with fuel header 116. The compressed gas header 114 is in fluid communication with the first fuel pressure vessel 109 and the second fuel pressure vessel 110. The compressed gas pressure vessel 112 is in fluid communication with the compressed gas header 114, and therethrough with the turbine speed control valve 118 through the first fuel pressure vessel 109, the second fuel pressure vessel 110, and the fuel header 116. A charge of liquid mono-propellant or fuel 22 is contained within the fuel module 108 and is in fluid communication with the energy recovery module 100.

A charge of compressed gas 24 is contained in the fuel module 108 and urges the charge of liquid mono-propellant or fuel 22 fluidly toward the energy recovery module 100 through the turbine speed control valve 118 and the power module 106 to the energy recovery module 100. Examples of suitable mono-propellants include hydrazine. Examples of suitable liquid fuels includes kerosene-based fuels, such as JP-8 by way of non-limiting example. Examples of suitable compressed gases include inert gas gases, such as substantially pure nitrogen by way of non-limiting example. Urging the liquid mono-propellant or fuel 22 fluidly toward the energy recovery module 100 using the compressed gas 24 simplifies the generator arrangement 104 (shown in FIG. 1) as no mechanical pump is required by the generator arrangement 104. In this respect, in certain embodiments, the turbine speed control valve 118 is configured to throttle flow of the liquid mono-propellant or fuel 22 using a variable orifice plate.

Figure 5:
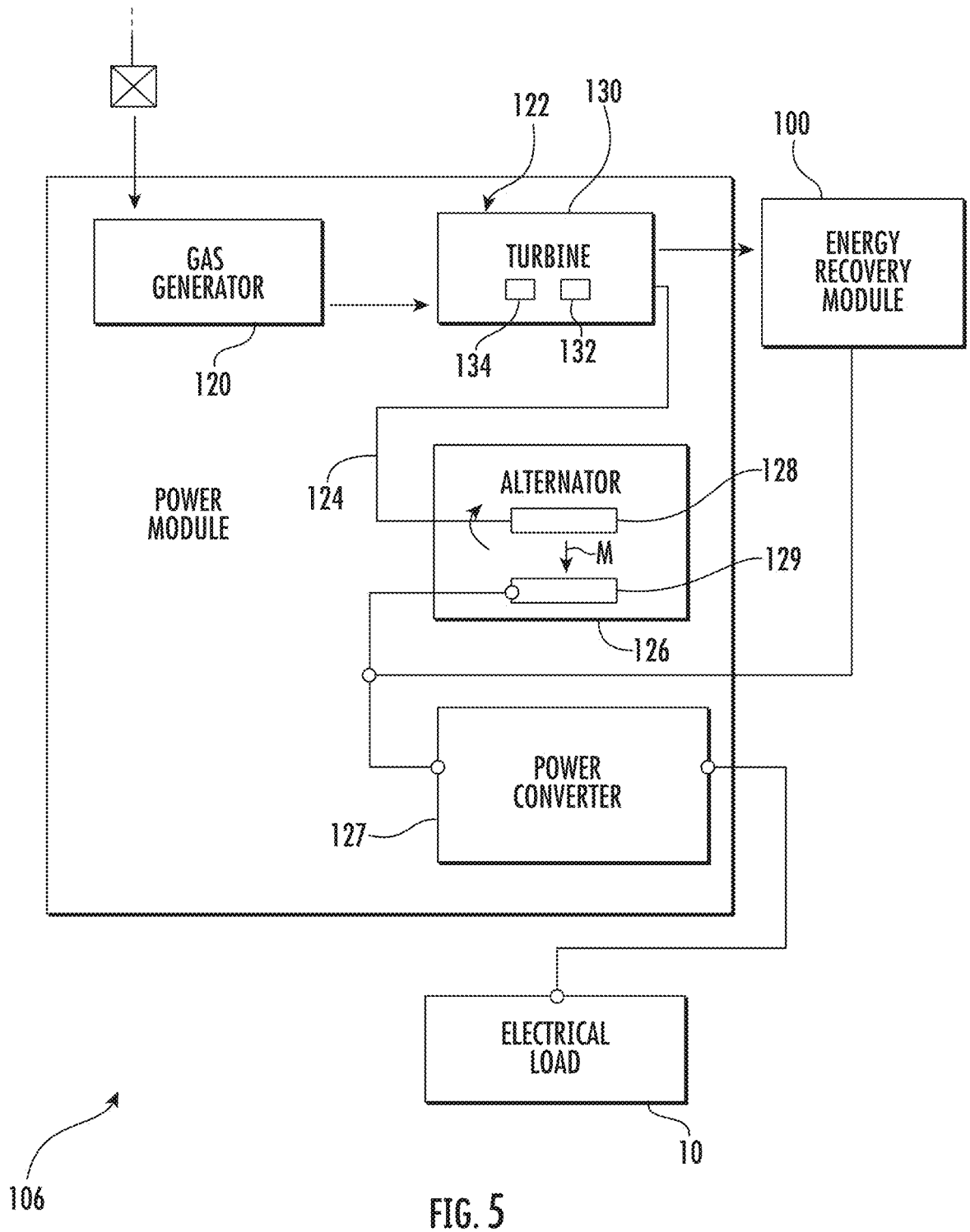
FIG. 5 is a schematic view of the power module of FIG. 1, showing expanded decomposition or combustion products being communicated to the energy recovery module to generate electrical power for the electrical load.

With reference to FIG. 5, the power module 106 is shown. The power module includes a gas generator 120, a turbine 122, an interconnect shaft 124, and an alternator 126. The gas generator 120 is in fluid communication with the fuel module 108 (shown in FIG. 1). The turbine 122 is in fluid communication with the gas generator 120. The interconnect shaft 124 is fixed relative to the turbine 122. The alternator 126 has one or more alternator permanent magnet 128 and a stator coil or winding 129 and is operably associated with the turbine 122. The one or more alternator permanent magnet 128 is fixed relative to the interconnect shaft 124 and rotates with the turbine 122. The stator coil or winding 129 is electrically connected to a power converter 127, which is arranged to converter electrical power generated by the alternator 126 into power suitable for the electrical load 10, e.g., variable frequency alternating current (AC) power into direct current (DC) power.

The turbine 122 is in fluid communication with the energy recovery module 100 to communicate the flow of expanded decomposition or combustion products 20 to the energy recovery module 100. In certain embodiments the turbine 122 is a microturbine 130. Employment of the microturbine 130 allows the power module 106 to be relatively small, e.g., the microturbine 130 having a diameter on the order of about four (4) inches. In accordance with certain embodiments the turbine 122 includes an impulse turbine 132. The impulse turbine 132 provides the power module 106 with a radially compact architecture. It is also contemplated that the turbine 122 have a single turbine stage 134. The single turbine stage 134 provides the power module 106 104 with an axially compact architecture. It is also contemplated that microturbine 130, the impulse turbine 132, and/or the single turbine stage 134 be in fluid communication with the energy recovery module 100 to communicate the flow of expanded decomposition or combustion products 20 to the energy recovery module 100.

Figure 6:
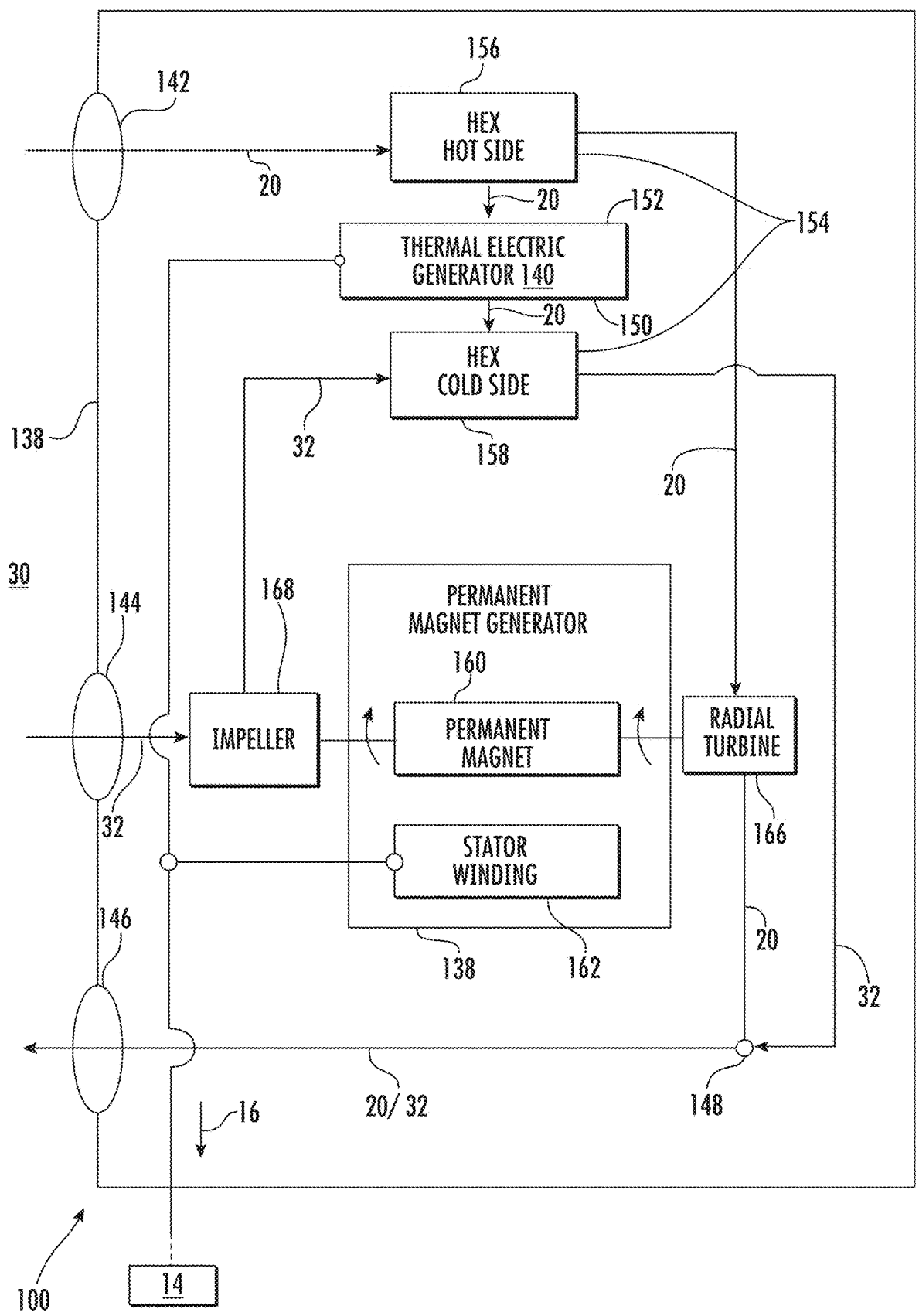
FIG. 6 is a schematic view of the energy recovery module of FIG. 1, showing a thermal electric generator and a permanent magnet generator extracting energy and generating electric power from expanded decomposition or combustion products traversing the energy recovery module.

With reference to FIG. 6, the energy recovery module 100 is shown. The energy recovery module 100 includes a manifold 136, a permanent magnet generator 138, and a thermal electric generator 140. The energy recovery module 100 also includes a heat exchanger 154, a radial turbine 166, and an impeller 168.

Figure 7:
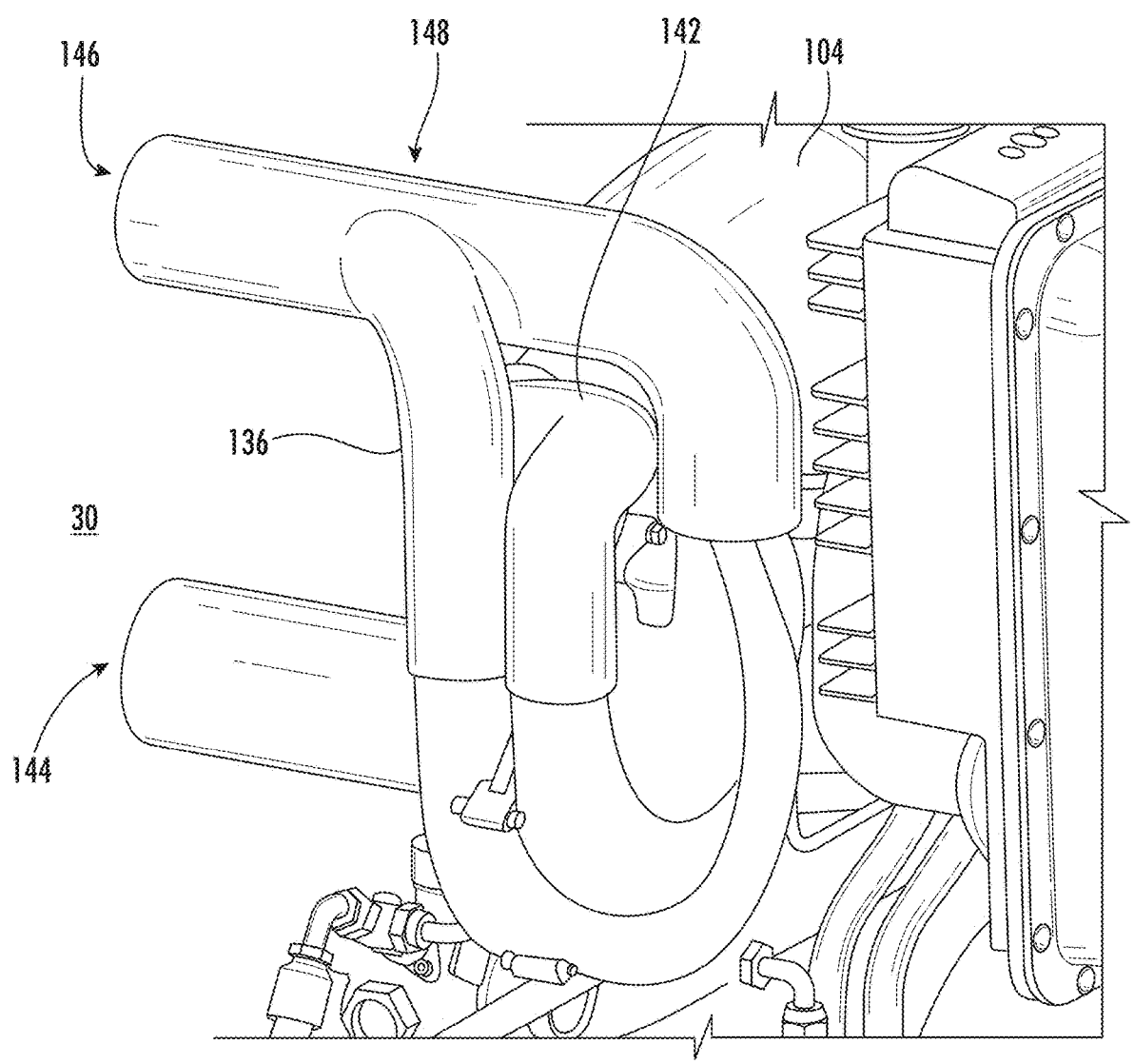
FIG. 7 is a perspective view of the energy recovery module of FIG. 1 according to an embodiment, showing a manifold containing the permanent magnet generator and the thermal electric generator of the energy recovery module.

As shown in FIG. 7, the manifold 136 defines an expanded decomposition or combustion product inlet 142, an ambient air inlet 144, and expanded decomposition or combustion product/ambient air mixture outlet 146. The manifold 136 also defines within its interior a union 148. The union 148 fluidly couples the expanded decomposition or combustion product inlet 142 and the ambient air inlet 144 to the expanded decomposition or combustion product/ambient air mixture outlet 146. Mixing ambient air, e.g., the ambient air 32 (shown in FIG. 6), ingested from the ambient environment 30 drawn through the ambient air inlet 144 with expanded decomposition or combustion products, e.g., expanded decomposition or combustion products 20 (shown in FIG. 6), received through the expanded decomposition or combustion product inlet 142 reduces temperature of mixed ambient air and expanded decomposition or combustion products issued to the ambient environment through the expanded decomposition or combustion product/ambient air mixture outlet 146, limiting the thermal signature of the generator arrangement 104 (shown in FIG. 1).

With continuing reference to FIG. 6, the permanent magnet generator 138 is arranged within the manifold 136 and includes one or more permanent magnet 160 and a coil or stator winding 162. The permanent magnet 160 is supported for rotation relative to the coil or stator winding 162 and is electromagnetically coupled to the coil or stator winding 162 for generating electric power using the rotation of the coil or stator winding 162. In this respect the coil or stator winding 162 is electrically connected to the power converter 127 (shown in FIG. 5), and therethrough to the electrical load 10 (shown in FIG. 1). The radial turbine 166 is operably connected to the permanent magnet generator 138, and therethrough to the impeller 168. In this respect the radial turbine 166 is fixed in rotation relative to the one or more permanent magnet 160 for rotation therewith about a rotation axis 174. The impeller 168 is also fixed in rotation relative to the one or more permanent magnet 160 for rotation therewith about the rotation axis 174.

Figure 8:
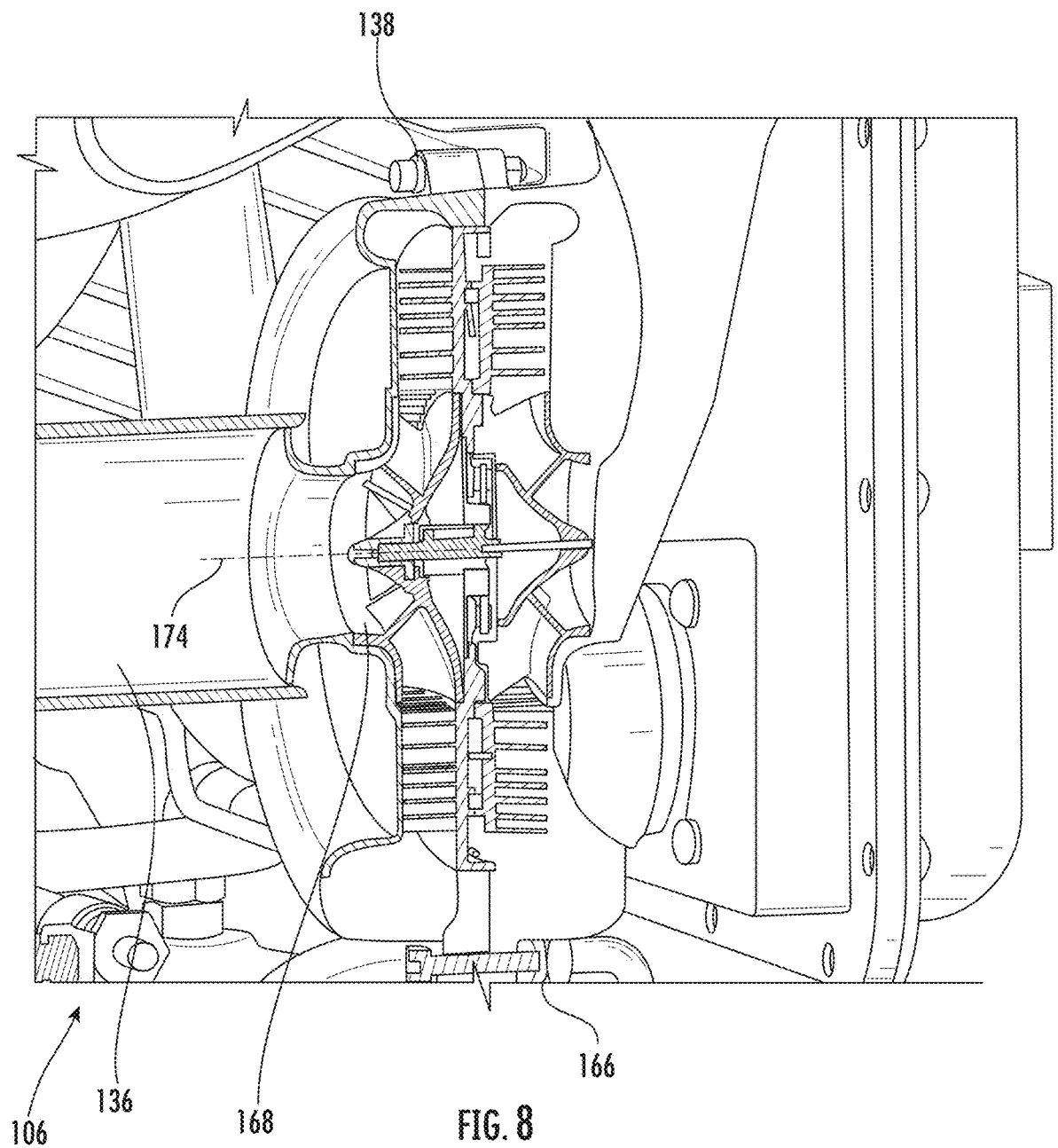
FIG. 8 is a cross-sectional view of a portion of the energy recovery module of FIG. 1 according to an embodiment, showing a permanent magnet generator and a thermal electric generator operatively associated with a heat exchanger and a radial turbine, respectively.

As shown in FIG. 8, it is contemplated that the impeller 168 and the radial turbine 166 be connected at axially opposite ends of the permanent magnet generator 138 along the rotation axis 174. This allows the impeller 168 and the radial turbine 166 to both be arranged upstream of the union 148 (shown in FIG. 6) within the manifold 136, the impeller 168 thereby being able to drive ambient air 32 in amounts corresponding to the amount of expanded decomposition or combustion products 20 traversing the energy recovery module 100.

With continuing reference to FIG. 6, the thermal electric generator 140 is arranged within the manifold 136, is electrically connected to the permanent magnet generator 138 for providing a portion of the electric power 16 to the electrical load 10, and has a hot side 150 and a cold side 152. The cold side 150 of the thermal electric generator 140 is in thermal communication with the flow of ambient air 32 drawn into the manifold 136 by the impeller 168. The hot side 154 of the thermal electric generator 140 is in thermal communication with the flow of expanded decomposition or combustion products 20 traversing the radial turbine 166. As will be appreciated by those of skill in the art in view of the present disclosure, this sinks the thermal electric generator 140 to the ambient environment 30 through the flow of ambient air 32, increasing the efficiency of the thermal electric generator 140.

Figure 9:
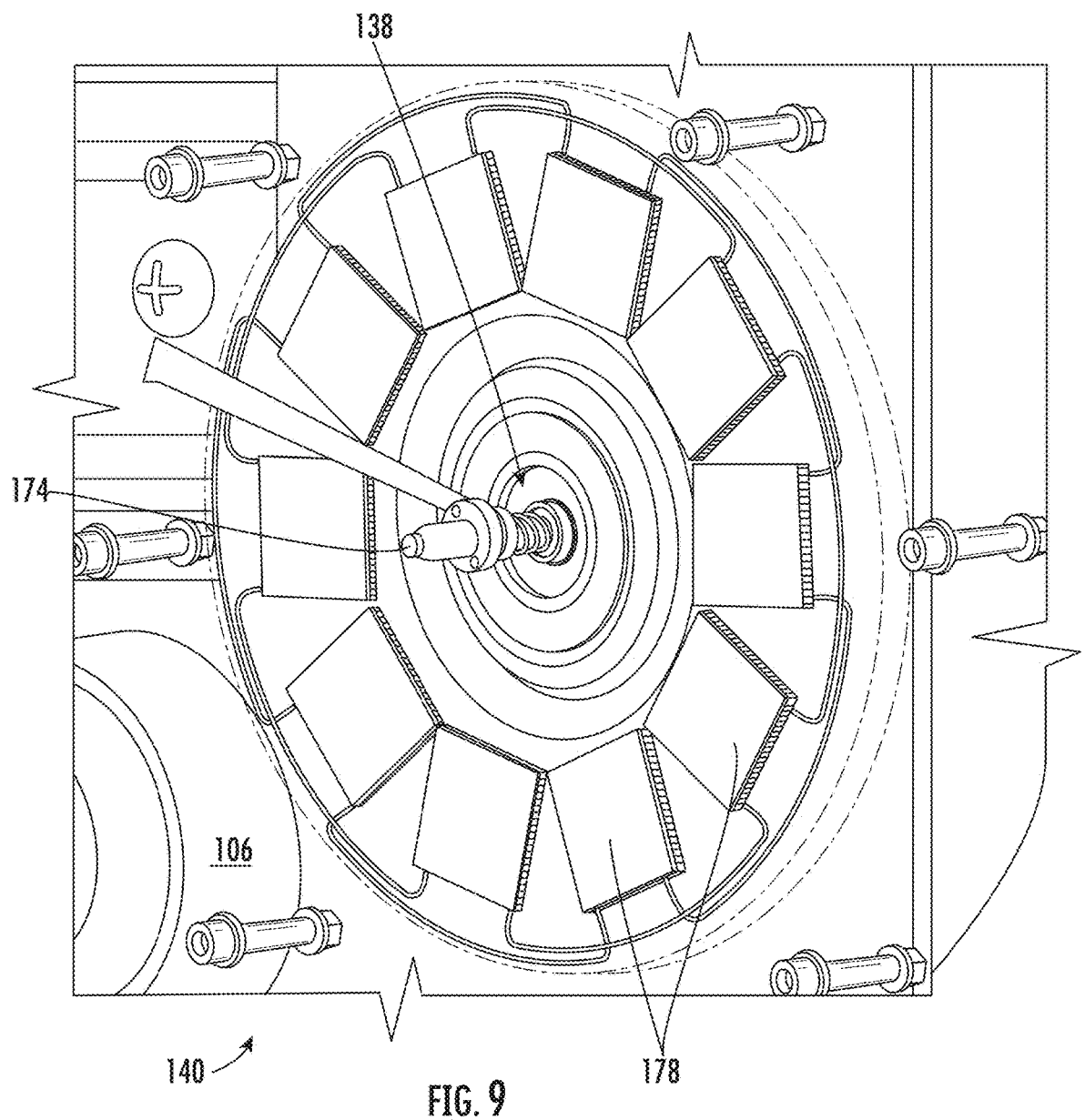
FIG. 9 is a perspective view of a portion of the energy recovery module of FIG. 1 according to an embodiment, showing a thermal electric generator array distributed circumferentially about a permanent magnet generator.

As shown in FIG. 9, it is contemplated that the thermal electric generator 140 can include a thermal electric generator element array 178. The thermal electric generator element array 178 can include a plurality of thermal electric generator elements 180 distributed circumferentially about the permanent magnet generator 138. As will be appreciated by those of skill in the art in view of the present disclosure, this increases the surface are of the thermal electric generator 140 available for thermal communication with the flow of ambient air 32 and the flow of expanded decomposition or combustion products 20, respectively, during traverse of the energy recovery module 100, thereby improving efficiency of the generator arrangement 104 (shown in FIG. 1).

With continuing reference to FIG. 6, the heat exchanger 154 is arranged within the manifold 136, is in thermal communication with the thermal electric generator 140, and includes a heat exchanger hot side 156 and a heat exchanger cold side 158. The heat exchanger hot side 156 is in fluid communication with the expanded decomposition or combustion products 20 and is thermally coupled to the hot side 152 of the thermal electric generator 140. The heat exchanger cold side 158 is in fluid communication with flow of ambient air 32 and is thermally coupled to the cold side 150 of the thermal electric generator 140.

Figure 10:
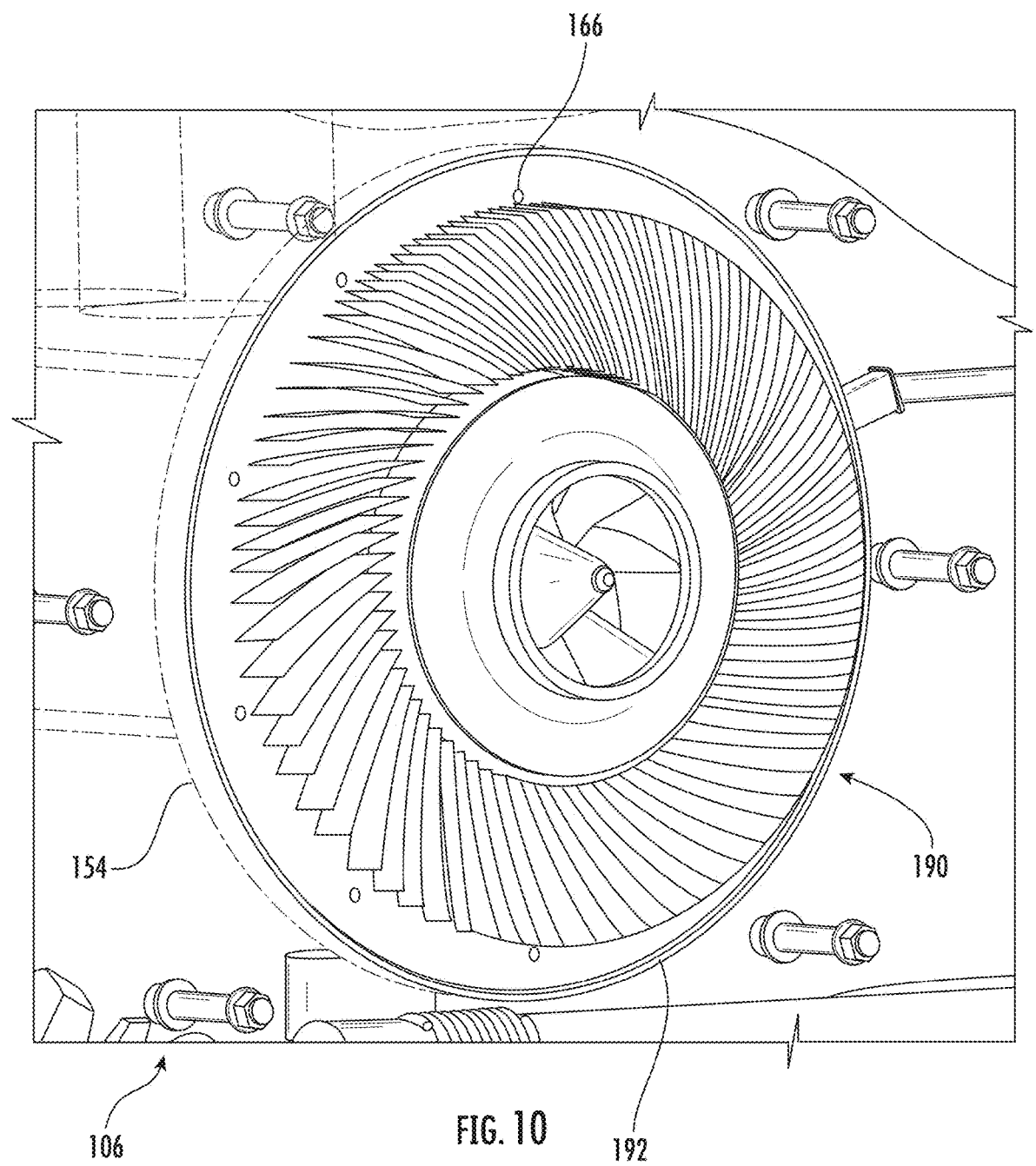
FIG. 10 is a perspective view of a portion of the energy recovery module of FIG. 1 according to an embodiment, showing a radial turbine and turbine nozzle vanes distributed about the radial turbine on a heat exchanger hot side.

As shown in FIG. 10, the heat exchanger 154 includes a turbine nozzle vane array 190. The turbine nozzle vane array 190 extends circumferentially about the permanent magnet generator 138 (shown in FIG. 6) and includes a plurality of turbine nozzle vanes 192. The plurality of turbine nozzle vanes 192 each extend axially from the heat exchanger 154, are distributed circumferentially about the radial turbine 166 such that the heat exchanger 154 extends circumferentially about the permanent magnet generator 138, and are in fluid communication with the expanded decomposition or combustion product inlet 142 (shown in FIG. 6) to receive the flow of expanded decomposition or combustion products 20 (shown in FIG. 6). This causes the turbine nozzle vanes 192 to communicate heat to the heat exchanger 154, and therethrough to the thermal electric generator 140, as the turbine nozzle vanes 192 direct the expanded decomposition or combustion products 20 toward the radial turbine 166, improving efficiency.

Figure 11:
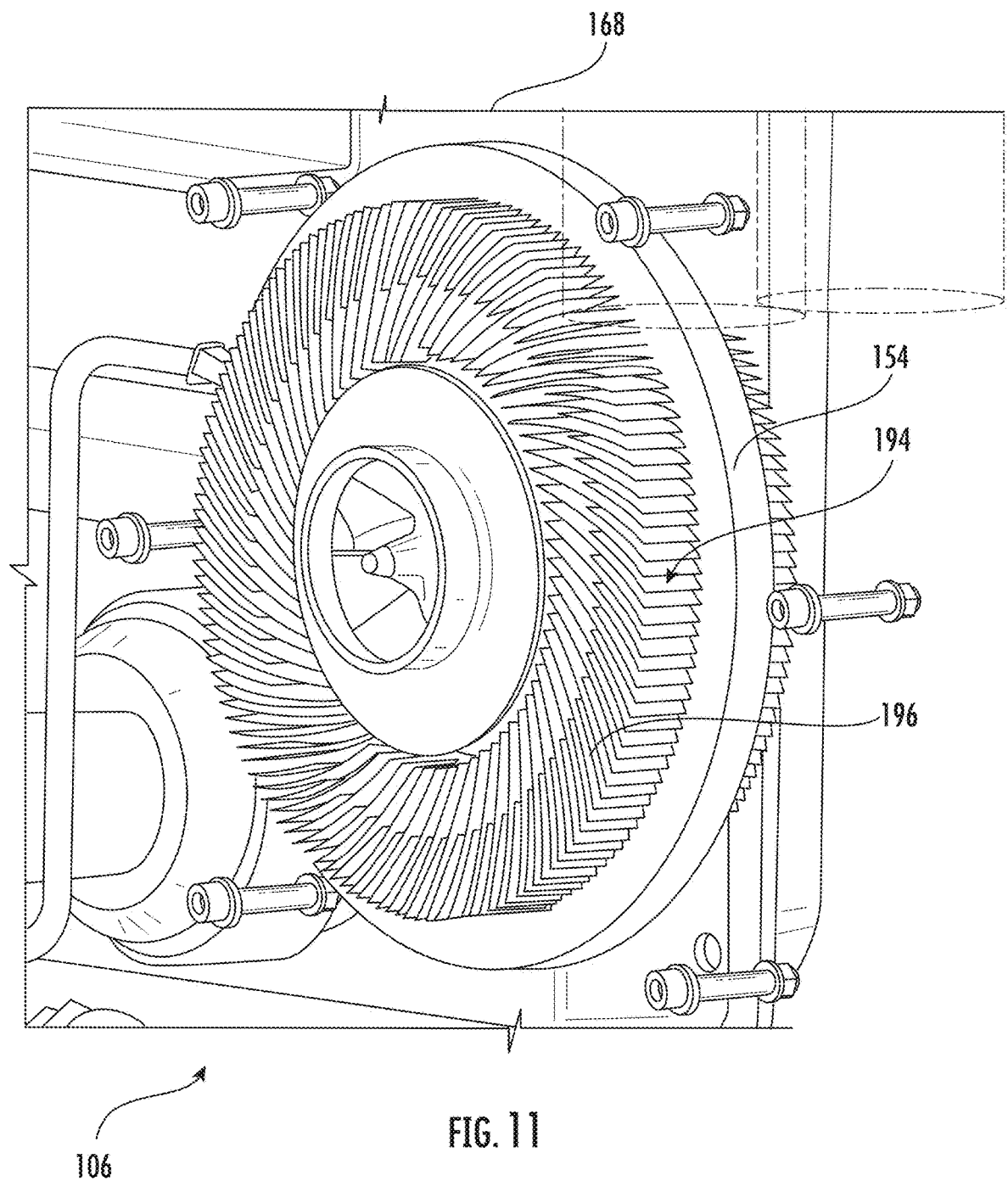
FIG. 11 is a perspective view of a portion of the energy recovery module of FIG. 1 according to an embodiment, showing an impeller and diffuser vanes distributed about the impeller and on a heat exchanger cold side.

As shown in FIG. 11, the heat exchanger 154 also includes a diffuser vane array 194. The diffuser vane array 194 extends circumferentially about the permanent magnet generator 138 (shown in FIG. 6) and includes a plurality of diffuser vanes 196. The plurality of diffuser vanes 196 extend axially from the heat exchanger 154 in a direction opposite that of the turbine nozzle vanes 192 (shown in FIG. 10), are distributed about the impeller 168, and fluidly couple the impeller 168 to the union 148 (shown in FIG. 6). The impeller 168 is in turn in fluid communication with the ambient air inlet 144 (shown in FIG. 6). As such the flow of relatively cool ambient air 32 drawn into the manifold 136 (shown in FIG. 6) draws heat from the heat exchanger 154 as the plurality of diffuser vanes 196 guide and diffuse the flow of ambient air 32 to the union 148, the ambient air 32 thereby serving as the cold side of the thermal electric generator 140 (shown in FIG. 6). In certain embodiments the diffuser vane array 194 and/or the turbine nozzle vane array 190 additionally operate to quiet the flow of the decomposition or combustion products 20 by imparting directionality into the flows prior to intermixing at the union 148, respectively.

Figure 12:
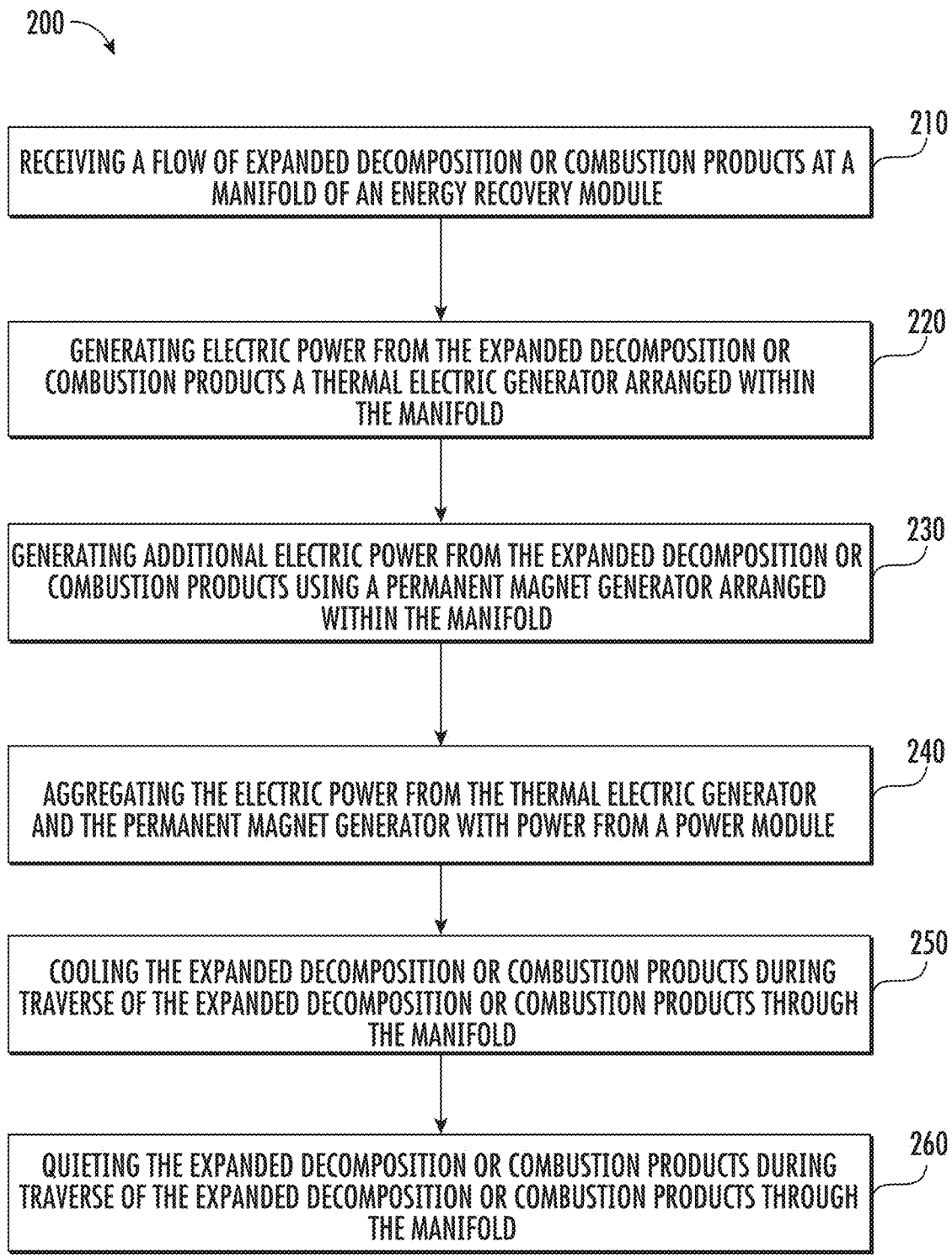
FIG. 12 is a block diagram of a method of generating electric power using a generator arrangement with an energy recovery module according to the present disclosure, showing operation of the method according to an embodiment of the method.

With reference to FIG. 12, a method 200 of generating electric power, e.g., the electric power 16 (shown in FIG. 3), is shown. The method 200 includes receiving a flow of expanded decomposition or combustion products at a manifold of an energy recovery module, e.g., the manifold 136 (shown in FIG. 6) of the energy recovery module 100 (shown in FIG. 1), as shown with box 210.

As shown with box 220, electric power is generated from the expanded decomposition or combustion products a thermal electric generator arranged within the manifold, e.g., thermal electric generator electric power 50 (shown in FIG. 6). As shown with box 230, additional electric power, e.g., permanent magnet generator electric power 52 (shown in FIG. 6), is also generated from the expanded decomposition or combustion products using a permanent magnet generator arranged within the manifold, e.g., the permanent magnet generator 138. It contemplated that the power from the thermal electric generator and power from the permanent magnet generator be aggregated with electric power from an alternator generator, e.g., the alternator 126 (shown in FIG. 5), as shown with box 240.

As shown with box 250, the expanded decomposition or combustion products are cooled during traverse of the expanded decomposition or combustion products through the manifold. As shown with box 260, the expanded decomposition or combustion products are also quieted during traverse of the expanded decomposition or combustion products through the manifold The term "about" is intended to include the degree of error associated with measurement of the particular quantity based upon the equipment available at the time of filing the application.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. An energy recovery module, comprising:
   a manifold;
   a permanent magnet generator arranged within the manifold; and
   a thermal electric generator arranged within the manifold, wherein the thermal electric generator is electrically connected to the permanent magnet generator to provide electrical power to an electrical load using energy recovered from an expanded decomposition or combustion product flow traversing the energy recovery module.

2. The energy recovery module as recited in claim 1, further comprising a heat exchanger arranged within the manifold, wherein the heat exchanger is in thermal communication with the thermal electric generator.

3. The energy recovery module as recited in claim 2, wherein the heat exchanger extends circumferentially about the permanent magnet generator.

4. The energy recovery module as recited in claim 2, wherein the heat exchanger has a diffuser vane array extending circumferentially about the permanent magnet generator.

5. The energy recovery module as recited in claim 2, wherein the manifold has a turbine nozzle vane array extending circumferentially about the permanent magnet generator.

6. The energy recovery module as recited in claim 1, wherein the manifold has an expanded decomposition or combustion products inlet, an ambient air inlet, and an expanded decomposition or combustion products/ambient air outlet each in fluid communication with the thermal electric generator.

7. The energy recovery module as recited in claim 6, wherein a cold side of the thermal electric generator fluidly couples the ambient air inlet with the expanded decomposition or combustion products/ambient air outlet.

8. The energy recovery module as recited in claim 6, wherein a hot side of the thermal electric generator fluidly couples expanded decomposition or combustion product inlet with the expanded decomposition or combustion product/ambient air mixture outlet.

9. The energy recovery module as recited in claim 6, wherein the manifold includes a union fluidly coupling the expanded decomposition or combustion product inlet and the ambient air inlet to the expanded decomposition or combustion product/ambient air mixture outlet.

10. The energy recovery module as recited in claim 1, wherein the permanent magnet generator includes a permanent magnet supported for rotation relative to the thermal electric generator about a rotation axis and a stator winding fixed relative to the thermal electric generator.

11. The energy recovery module as recited in claim 10, further comprising a radial turbine fixed relative to the permanent magnet recover energy from the expanded decomposition or combustion product flow traversing the energy recovery module.

12. The energy recovery module as recited in 10, further comprising an impeller fixed relative to the permanent magnet to draw ambient air into the manifold to cool the expanded decomposition or combustion product flow traversing the energy recovery module.

13. A generator arrangement, comprising:
    an energy recovery module as recited in claim 1;
    a power module in fluid communication with the manifold; and
    a fuel module in fluid communication the power module to provide flow of liquid fuel for generating electric power with the power module.

14. The generator arrangement as recited in claim 13, wherein the power module includes a power converter, wherein the power converter is electrically connected to (a) the power module, (b) the permanent magnet generator, and (c) the thermal electric generator to provide electric power from both the power module and the energy recovery module to the electrical load.

15. The generator arrangement as recited in claim 13, wherein the power module includes a microturbine in fluid communication with the energy recovery module to communicate the expanded decomposition or combustion products to the energy recovery module.

16. The generator arrangement as recited in claim 13, wherein the power module comprises:
    a gas generator in fluid communication with the fuel module;
    a turbine in fluid communication with the gas generator;
    an interconnect shaft fixed relative to the turbine; and
    an alternator with one or more alternator permanent magnet and an alternator stator coil or winding operably associated with the turbine, wherein the one or more alternator permanent magnet is fixed relative to the interconnect shaft.

17. The generator arrangement as recited in claim 13, wherein the fuel module comprises:
   a fuel header in fluid communication with the power module through a turbine speed control valve;
   a first fuel pressure vessel and a second fuel pressure vessel in fluid communication with the fuel header;
   a compressed gas header in fluid communication with the first fuel pressure vessel and the second fuel pressure vessel; and
   a compressed gas pressure vessel in fluid communication with the compressed gas header, and therethrough with the turbine speed control valve through fuel header and first fuel pressure vessel and the second fuel pressure vessel.

18. The generator arrangement as recited in claim 13, further comprising:
   a charge of liquid mono-propellant or fuel contained in the fuel module and in fluid communication with the energy recovery module; and
   a charge of compressed gas contained in the fuel module and urging the charge of liquid mono-propellant or fuel fluidly toward the energy recovery module.

19. An unmanned aerial vehicle, comprising:
   an energy recovery module as recited in claim 1, wherein the energy recovery module is carried by the unmanned aerial vehicle;
   a power module with a microturbine in fluid communication with the energy recovery module, wherein the power module is carried by the unmanned aerial vehicle; and
   a fuel module in fluid communication with the power module and carried by the unmanned aerial vehicle, wherein the energy recovery module is electrically connected to an electrical load carried by the unmanned aerial vehicle.

20. A method of generating electric power, comprising:
   receiving a flow of expanded decomposition or combustion products at a manifold of an energy recovery module;
   generating electric power from the expanded decomposition or combustion products a thermal electric generator arranged within the manifold;
   generating additional electric power from the expanded decomposition or combustion products using a permanent magnet generator arranged within the manifold;
   cooling the expanded decomposition or combustion products during traverse of the expanded decomposition or combustion products through the manifold; and
   quieting the expanded decomposition or combustion products during traverse of the expanded decomposition or combustion products through the manifold.

* * * * *